(12) United States Patent
Hawker et al.

(10) Patent No.: US 6,512,070 B2
(45) Date of Patent: Jan. 28, 2003

(54) DUAL PURPOSE ELECTROACTIVE COPOLYMERS

(75) Inventors: Craig Jon Hawker, Los Gatos, CA (US); Gerrit Klaerner, San Jose, CA (US); Jeong-Ik Lee, Suwon (KR); Victor Yee-Way Lee, San Jose, CA (US); Robert Dennis Miller, San Jose, CA (US); John Campbell Scott, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/819,116

(22) Filed: Mar. 27, 2001

(65) Prior Publication Data

US 2002/0045719 A1 Apr. 18, 2002

Related U.S. Application Data

(62) Division of application No. 09/313,903, filed on May 18, 1999, now Pat. No. 6,355,756.

(51) Int. Cl.[7] .............................................. C08F 112/06
(52) U.S. Cl. ................... 526/347.1; 526/171; 526/204; 526/217; 526/260; 526/261; 526/270; 526/287; 526/293; 526/310; 526/347
(58) Field of Search ................................ 526/171, 204, 526/217, 260, 261, 270, 287, 293, 310, 347, 347.1

(56) References Cited

U.S. PATENT DOCUMENTS

| | | | |
|---|---|---|---|
| 4,581,429 A | 4/1986 | Solomon et al. | |
| 4,933,394 A | 6/1990 | Foos | |
| 5,312,871 A | 5/1994 | Mardare et al. | |
| 5,322,912 A | 6/1994 | Georges et al. | |
| 5,401,804 A | 3/1995 | Georges et al. | |
| 5,412,047 A | 5/1995 | Georges et al. | |
| 5,443,921 A | * 8/1995 | Hosokawa et al. | 428/690 |
| 5,449,724 A | 9/1995 | Moffat et al. | |
| 5,498,679 A | 3/1996 | Moffat et al. | |
| 5,552,502 A | 9/1996 | Odell et al. | |
| 5,610,249 A | 3/1997 | Ogawa | |
| 5,610,250 A | 3/1997 | Veregin et al. | |
| 5,627,248 A | 5/1997 | Koster et al. | |
| 5,677,388 A | 10/1997 | Koster et al. | |
| 5,721,320 A | 2/1998 | Priddy et al. | |
| 5,723,511 A | 3/1998 | Kazmaier et al. | |
| 5,723,554 A | 3/1998 | Fujita et al. | |
| 5,728,747 A | 3/1998 | Kazmaier et al. | |
| 5,739,229 A | 4/1998 | Keoshkerian et al. | |
| 5,744,560 A | 4/1998 | Foucher et al. | |
| 5,763,548 A | 6/1998 | Matyjaszewski et al. | |
| 5,773,510 A | 6/1998 | Kazmaier et al. | |
| 5,783,646 A | 7/1998 | Kihara et al. | |

FOREIGN PATENT DOCUMENTS

| EP | 0 672 741 A1 * | 9/1995 |
|---|---|---|
| SU | 478838 | 3/1976 |
| WO | WO 97/05184 | 2/1997 |

* cited by examiner

*Primary Examiner*—Helen L. Pezzuto
(74) *Attorney, Agent, or Firm*—Reed & Associates

(57) ABSTRACT

Multifunctional electroactive copolymers are provided. The copolymers may be A-B-A triblock copolymers, brush-type graft copolymers, or variations thereof. In a preferred embodiment, the copolymers are "dual use" in that they comprise both a light emitting segment and a charge transport segment. Methods of synthesizing the novel electroactive copolymers are provided as well, as are opto-electronic devices, particularly LEDs, fabricated with the novel copolymers.

15 Claims, 10 Drawing Sheets

Synthesis of End Capping Initiator 1:

Synthesis of Macromolecular End Capper P1:

Synthesis of Macromolecular End Capper P2:

Synthesis of Macromolecular End Capper P3:

Synthesis of Macromolecular Initiator P4:

Macromolecular Initiation to Provide P5:

Macromolecular Initiation to Provide P6:

Synthesis of a Radical Initiating Condensation Monomer:

DUAL PURPOSE ELECTROACTIVE COPOLYMERS

CROSS-REFERENCE TO RELATED APPLICATIONS

This is a divisional of U.S. patent application Ser. No. 09/313,903, filed May 18, 1999, which issued on Mar. 12, 2002 as U.S. Pat. No. 6,355,756.

TECHNICAL FIELD

This invention relates generally to electroactive polymers. More particularly, the invention pertains to dual purpose electroactive copolymers, preparation thereof, and use in the manufacture of various types of opto-electronic devices.

BACKGROUND

Electroactive polymers are frequently used in a number of optical and electronic applications such as in light emitting diodes ("LEDs"), photovoltaic energy converters, photodetectors, photoconductors, e.g., in electrophotography, and in chemical and biochemical sensors. In each of these applications, it is often necessary to use a multiplicity of electroactive polymeric materials each having a different function in the device. For example, different polymeric materials are normally used to provide electron and/or hole charge transport, luminescence, photo-induced charge generation, and charge blocking or storage. By working with a number of structurally and functionally distinct polymers, one can achieve optimization of these separate functions.

It would be desirable, however, to reduce the number of polymeric materials needed in any particular opto-electronic device. In this way, the manufacture of opto-electronic devices is simplified by reducing the time, cost and number of materials involved in device fabrication.

The present invention is addressed to the aforementioned need in the art. A new class of electroactive polymers is now provided, comprising copolymers in which discrete and functionally unique segments present in a single polymer render the polymer multifunctional in nature. In a preferred embodiment, the electroactive copolymers are "dual use" polymers by virtue of containing both a charge transport segment and a light emissive segment. The invention represents an important advance in the art, insofar as the number of polymeric materials previously required in the manufacture of opto-electronic devices may now be significantly reduced. That is, with the present invention, fewer discrete and functionally unique polymeric layers are now necessary to provide all of the desired functions, e.g., electron transport, hole transport, light emission, and the like.

SUMMARY OF THE INVENTION

Accordingly, it is a primary object of the invention to address the above-mentioned need in the art by providing a dual purpose electroactive copolymer useful in the manufacture of an opto-electronic device.

It is another object of the invention to provide such a copolymer which comprises a charge transporting polymeric segment and a light emitting polymeric segment.

It is still another object of the invention to provide such a copolymer in the form of an A-B-A triblock copolymer.

It is yet another object of the invention to provide such a copolymer in the form of a brush-type graft copolymer.

It is an additional object of the invention to provide methods for synthesizing dual use electroactive polymers as disclosed and claimed herein.

It is still an additional object of the invention to provide opto-electronic devices, particularly LEDs, fabricated with a dual use electroactive copolymer as disclosed and claimed herein.

Additional objects, advantages and novel features of the invention will be set forth in part in the description which follows, and in part will become apparent to those skilled in the art upon examination of the following, or may be learned by practice of the invention.

DETAILED DESCRIPTION OF THE INVENTION

Overview and Definitions

Figure 1:
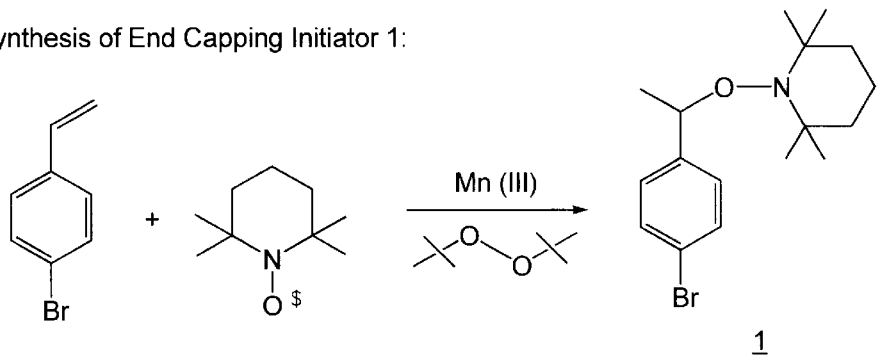
FIG. 1 schematically illustrates preparation of an end capping initiator and two macromolecular end capping reagents, as described in Examples 1, 2 and 3, respectively.
Figure 1:
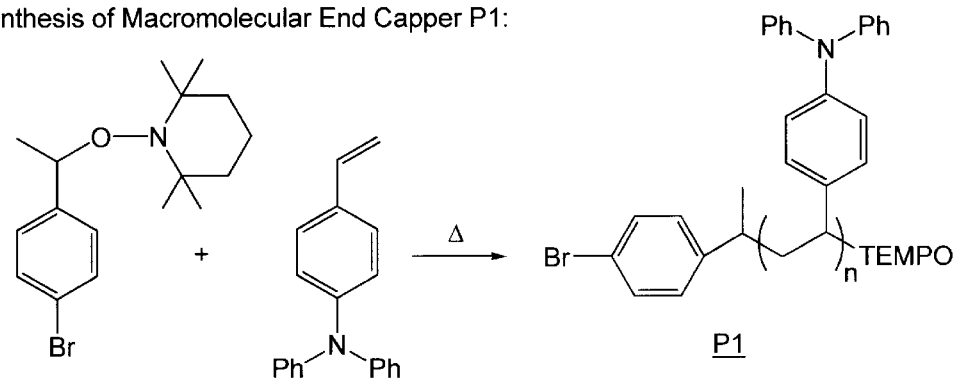
Figure 1:
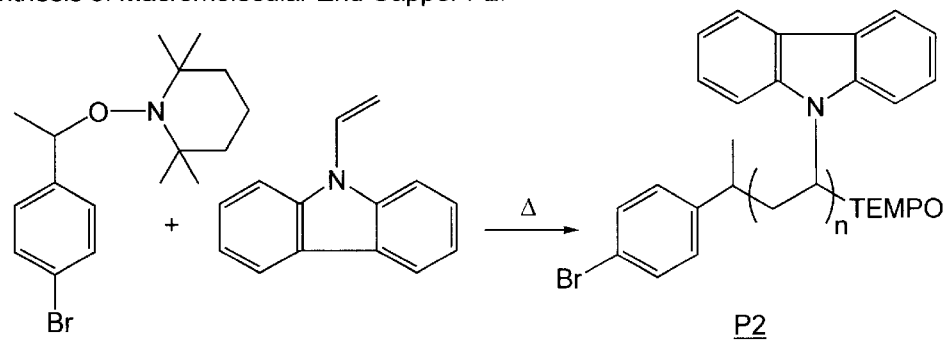

Before describing the present invention in detail, it is to be understood that this invention, unless otherwise indicated, is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "an," and "the" include plural referents unless the context clearly dictates otherwise. Thus, for example, reference to "a polymeric segment" includes more than one polymeric segment, reference to "a layer" or "a polymeric layer" includes multiple layers, reference to "a reagent" includes mixtures of reagents, and the like.

In describing and claiming the present invention, the following terminology will be used in accordance with the definitions set out below.

The term "polymer" is used to refer to a chemical compound that comprises linked monomers, and that may or may not be linear. The electroactive copolymers of the present invention generally comprise at least about 20 monomer units, preferably at least about 50 monomer units, and generally fewer than about 200 monomer units, preferably fewer than about 150 monomer units.

The term "electroactive" as used herein refers to a material that is (1) capable of transporting, blocking or storing charge (either + or −), (2) luminescent, typically although not necessarily fluorescent, and/or (3) useful in photoinduced charge generation.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms.

The term "alkenyl" as used herein refers to a branched or unbranched hydrocarbon group of 2 to 24 carbon atoms containing at least one double bond, typically containing one to six double bonds, more typically one or two double bonds, e.g., ethenyl, n-propenyl, n-butenyl, octenyl, decenyl, and the like, as well as cycloalkenyl groups such as cyclopentenyl, cyclohexenyl and the like. The term "lower alkenyl" intends an alkenyl group of two to six carbon atoms, preferably two to four carbon atoms.

The term "alkynyl" as used herein refers to a branched or unbranched hydrocarbon group of 2 to 24 carbon atoms containing at least one triple bond, e.g., ethynyl, n-propynyl, n-butynyl, octynyl, decynyl, and the like, as well as cycloalkynyl groups such as cyclooctynyl, cyclononynyl, and the like. The term "lower alkynyl" intends an alkynyl group of two to six carbon atoms, preferably two to four carbon atoms.

The term "alkoxy" as used herein refers to a substituent —O—R wherein R is alkyl as defined above. The term "lower alkoxy" refers to such a group wherein R is lower alkyl.

The terms "aryl" and "aromatic," as used herein, and unless otherwise specified, refer to an aromatic moiety containing one to seven aromatic rings. For aryl groups containing more than one aromatic ring, the rings may be fused or linked. Aryl groups are optionally substituted with one or more substituents per ring; suitable substituents include, for example, halo, haloalkyl, alkyl, alkenyl, alkynyl, alkoxy, alkoxycarbonyl, carboxy, nitro, cyano and sulfonyl. The term "aryl" is also intended to include heteroaromatic moieties, i.e., aromatic heterocycles. Generally the heteroatoms will be nitrogen, oxygen or sulfur.

The term "arylene" as used herein, and unless otherwise specified, refers to a bifunctional aromatic moiety containing two to seven aromatic rings that are either fused or linked. Arylene groups are optionally substituted with one or more substituents per ring; as above, suitable substituents include halo, haloalkyl, alkyl, alkenyl, alkynyl, alkoxy, alkoxycarbonyl, carboxy, nitro, cyano and sulfonyl.

The term "halo" is used in its conventional sense to refer to a chloro, bromo, fluoro or iodo substituent. In the compounds described and claimed herein, halo substituents are generally bromo, chloro or iodo, preferably bromo or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom. "Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

The invention thus provides electroactive copolymers that comprise both a charge transporting polymeric segment and a light emitting polymeric segment. The presence of these discrete and functionally unique segments in a single polymer molecule renders the copolymer multifunctional in nature (i.e., "dual purpose" at a minimum), insofar as the copolymer is both luminescent, i.e., light emitting, and capable of transporting charge, either positive or negative.

Triblock Copolymers

In one embodiment, the novel copolymers are A-B-A triblock copolymers, in which one of A and B is a charge transporting polymeric segment and the other is a light emitting polymeric segment. Preferably, it is each A block that is a charge transporting polymeric segment, while the B block is a light emitting polymeric segment.

The monomer units present in the charge transporting polymeric segment are selected to correspond to the intended use of the polymer. When the charge transporting segment is to be hole transporting, the monomer units in the segment are preferably arylamines, e.g., triphenylamine, diphenyltolylamine, tetraphenyl-p-phenylene diamine, tetraphenylbenzidine, an arylamine-containing polynuclear aromatic and/or heteroaromatic compound, or a diarylamine such as an N-substituted carbazole or an aminobenzaldehyde hydrazone. When the charge transporting segment is to be an electron transporting segment, i.e., when the copolymer is used as an electron transport layer in an LED, photoconductor or the like, the monomer units are preferably electron deficient moieties that are "conjugated" in the polymer structure, and include heterocyclic and/or nonheterocyclic aromatic groups, e.g., aryl sulfones (e.g., biphenyl sulfone), aryl sulfoxides, fluorinated aryls (such as bis (diphenylhexafluoropropane) and octafluorobiphenyl), biphenyls, diaryl phosphine oxides, benzophenones, 1,2,3-triazole, 1,2,4-triazole, 1,2,3-oxadiazole, 1,2,4-oxadiazole (azoxime), 1,2,5-oxadiazole (furazan), 1,3,4-oxadiazole, 3,5-diaryl-1,2,4-oxadiazole, 3,4-diaryl-1,2,5-oxadiazole, 2,5-diaryl-1,3,4-oxadiazole, 1,4-oxazine, 1,2,5-oxathiazine, thiophene, benzothiophene, pyridines, quinolines (including quinoline and isoquinoline), quinoxalines, and pyrimidines.

The monomer units in the light emitting polymeric segment are aromatic or heteroaromatic, and include polycyclic aromatic moieties that are typically although not necessarily fluorescent. These monomer units include without limitation benzene, naphthalene, anthracene, phenanthrene, indene, pyrene, perylene, phenalene, coronene, fluorescein, fluorene, substituted fluorene, and the like. Exemplary monomers for forming the light emitting polymeric segment are those that have previously been disclosed in co-pending, commonly assigned U.S. patent application Ser. No. 08/888, 172, filed Aug. 27, 1997, entitled "Polymeric Light-Emitting Device," as useful for forming an emissive layer, e.g., in an LED. Those monomers include: dihalo-fluorene optionally substituted with one or more substituents other (i.e., non-halogen substituents) such as phenyl, benzyl, phenoxy, benzyloxy, lower alkyl or lower alkoxy, preferably at but not restricted to the 9-position, e.g., 9,9-dialkylfluorene and 9,9-diphenylfluorene; and dihaloanthracene optionally substituted with one or more of the aforementioned substituents, e.g., 9,10-, 2,6-, 1,8- or 1,4-dihaloanthracene or dihalodiphenylanthracenes. Aromatic dyes, e.g., coumarins, rhodamines, pyrans, or the like may also serve as monomer units in the light emitting polymeric segment, for example, to provide a copolymer that can be used as a photoconductive sensitizer.

A-B-A triblock copolymers of the invention, wherein A is a charge transporting polymeric segment and B is a light emissive polymeric segment, may be synthesized using either of two techniques. A first synthetic method comprises: (a) contacting a dihalo-substituted polycyclic aromatic reactant with a haloaryl moiety also containing a living free radical polymerization initiator under conditions effective to bring about condensation polymerization, resulting in a light emitting polymeric intermediate comprised of linked polycyclic aromatic monomer units and two or more displaceable termini; and (b) synthesizing, at each of the termini of the intermediate prepared in step (a), a charge transport segment comprised of polymerized monomer units. The polymeric end-capping reagents prepared in step (b) are preferentially synthesized via living free radical polymerization. Part (a) of the method may be shown schematically as follows:

Scheme 1

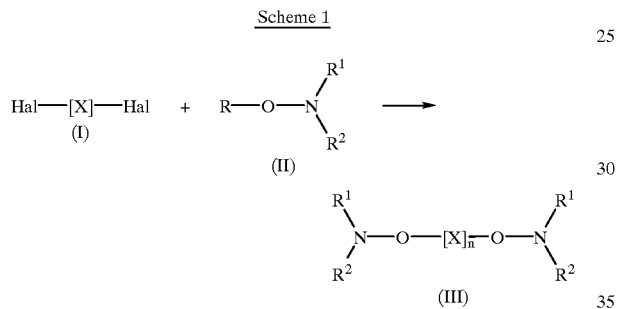

In the above scheme, compound (I) is the dihalo-substituted polycyclic aromatic reactant, wherein Hal represents a halogen atom, typically chloro or bromo, and X is an aromatic or heteroaromatic moiety as explained earlier herein. That is, X is generally although not necessarily fluorescent, and may be, for example, benzene, naphthalene, anthracene, phenanthrene, indene, pyrene, perylene, phenalene, coronene, fluorescein, fluorene, substituted fluorene, and the like. In a preferred embodiment, X is fluorene substituted with one or more substituents such as phenyl, benzyl, phenoxy, benzyloxy, lower alkyl or lower alkoxy, preferably but not necessarily at the 9-position, as in 9,9-dialkylfluorene and 9,9-diphenylfluorene. Compound (II) is a living free radical polymerization initiator, in which the free radical R. is capable of end capping the polymerization of (I), and $R^1$ and $R^2$ are each independently alkyl or aryl, including substituted and unsubstituted alkyl and aryl, wherein the substituents are, for example, cyano, carboxyl, and the like, or $R^1$ and $R^2$ together form an optionally alkyl-substituted cycloalkyl ring containing 4 to 7, typically 5 or 6, carbon atoms. No hydrogen atoms should be present on the carbon atoms adjacent to N in the —$NR^1R^2$ group. Suitable R groups are alkyl, aryl, aryl-substituted alkyl, although preferred R groups comprise halogenated aryl moieties. Examples of specific R groups include phenyl, substituted phenyl (particularly halogenated phenyl such as p-bromophenyl and p-chlorophenyl), benzyl, substituted benzyl (particularly halogenated benzyl), lower alkyl, particularly methyl and tertiary butyl, and cyanoisopropyl. In general the structure of R will be of the formula

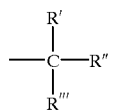

wherein R', R" and R'" are the same or different and are selected from the group consisting of hydrogen, alkyl, halogenated alkyl, phenyl, halogenated phenyl, benzyl, and halogenated benzyl. Suitable living free radical polymerization initiators are derivatives of 2,2,6,6-tetramethyl-1-piperidinyloxy ("TEMPO"), having the structural formula

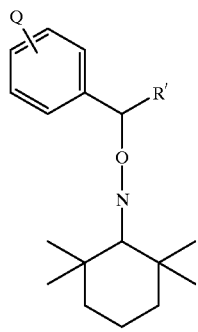

wherein R' is as defined above, and Q is halogen, preferably chloro or bromo. The "TEMPO" moiety itself has the structural formula

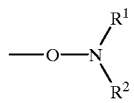

The polymeric intermediate (III) comprises a light emitting polymeric segment represented by —$[X]_n$—and having two displaceable termini

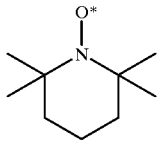

deriving from the nitroxyl groups of the polymerization initiator.

The reaction illustrated in Scheme 1 is preferably conducted in the presence of a catalyst, preferably a nickel catalyst. Exemplary nickel catalysts include ligand-substituted Ni (0) complexes and ligand-substituted Ni (II) complexes that generate Ni (0) in situ; it may be desirable to use a reducing agent such as Zn with the latter class of catalysts. Particularly preferred nickel catalysts include bis (1,5-cyclooctadiene) nickel (0) and nickel carbonyl tris (triphenylphosphine) nickel (0).

Step (b) of the reaction, wherein polymer blocks are synthesized at the termini of the intermediate (III), may be represented schematically as follows:

Scheme 2

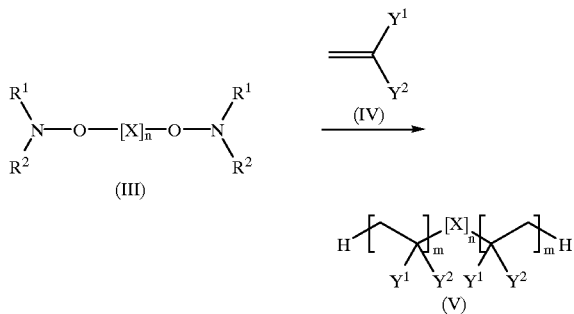

Scheme 3

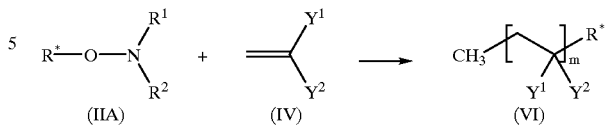

Polymerization of the vinyl moiety (IV), i.e., $CH_2=CY^1Y^2$, at the termini of intermediate (III) results in two conjugated terminal blocks, each of which is bound to the central segment, to provide the "A-B-A" triblock structure (V). In this process, the nitroxyl-terminated intermediate (III) serves as an initiator for the living free radical polymerization of the vinyl monomer (IV). The molecular moieties $Y^1$ and $Y^2$, which may be the same or different, are either electron-deficient or electron-rich monomer units that provide a vinyl polymer following initiation of polymerization, as discussed above. That is, $Y^1$ and $Y^2$ are typically heterocyclic and/or nonheterocyclic aromatic groups, e.g., aryl sulfones (e.g., biphenyl sulfone), aryl sulfoxides, fluorinated aryls (such as bis(diphenylhexafluoropropane) and octafluorobiphenyl), biphenyl, a diaryl phosphine oxide, a benzophenone, 1,2,3-triazole, 1,2,4-triazole, 1,2,3-oxadiazole, 1,2,4-oxadiazole (azoxime), 1,2,5-oxadiazole (furazan), 1,3,4-oxadiazole, 3,5-diaryl-1,2,4-oxadiazole, 3,4-diaryl-1,2,5-oxadiazole, 2,5-diaryl-1,3,4-oxadiazole, 1,4-oxazine, 1,2,5-oxathiazine, benzothiophene, thiophene, pyridine, a quinoline (including quinoline and isoquinoline), a quinoxaline, a pyrimidine, or the like. When the charge transporting segment is to be hole transporting, the monomer units in the segment are preferably arylamines, e.g., triphenylamine, diphenyltolylamine, tetraphenyl-p-phenylene diamine, tetraphenylbenzidine, an arylamine-containing polynuclear aromatic and/or heteroaromatic compound, or a diarylamine such as an N-substituted carbazole or an aminobenzaldehyde hydrazone. In the triblock copolymer product (V), m is typically in the range of approximately 10 to 200, preferably 10 to 100, while n is generally in the range of approximately 2 to 50, preferably 6 to 50.

An alternative synthetic route to these A-B-A triblock copolymers involves (a) contacting a unimolecular living free radical polymerization initiator with a polymerizable reactant under polymerization conditions, wherein the initiator, the reactant, and the polymerization conditions are effective to provide a charge transporting polymeric intermediate comprised of a plurality of linked monomer units and a single reactive terminus; and (b) catalytically polymerizing a dihalo-substituted polycyclic aromatic reactant in the presence of the charge transporting polymeric intermediate, whereby a light emitting polymeric segment comprised of linked polycyclic aromatic monomer units is formed, with two or more charge transporting polymeric segments bound thereto. This may be shown schematically as follows:

The unimolecular living free radical polymerization initiator is shown at (IIA), wherein $R^1$ and $R^2$ are as defined earlier herein and wherein R* is identical to R but contains a reactive site that enables binding of an additional moiety, as carried out in step (b). The polymerizable reactant is shown at (IV), wherein $Y^1$ and $Y^2$ are as defined earlier herein as well. The reaction forms a monofunctionalized polymeric charge transporting block, i.e., the charge transporting polymeric intermediate (VI), comprised of a plurality of linked monomer units "—$CH_2$—$C(Y^1Y^2)$—" and a single reactive terminus R*. Step (b) may be represented as follows:

Scheme 4

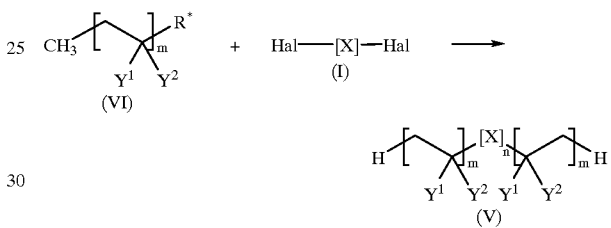

In step (b), the charge transporting polymeric intermediate having the single reactive terminus, i.e., structure (VI), is caused to react with a dihalo-substituted polycyclic aromatic reactant (I), wherein Hal and X are as defined above, in the presence of a suitable catalyst, preferably a nickel catalyst such as bis (1,5-cyclooctadiene) nickel (0). The reaction results in a triblock copolymer shown at (V) in which the central block is a light emitting polymeric segment comprised of linked aromatic monomer units, and the outer blocks are charge transporting polymeric segment comprised of electron-deficient or electron-rich monomeric moieties.

Brush-Type Graft Copolymers

Figure 3:
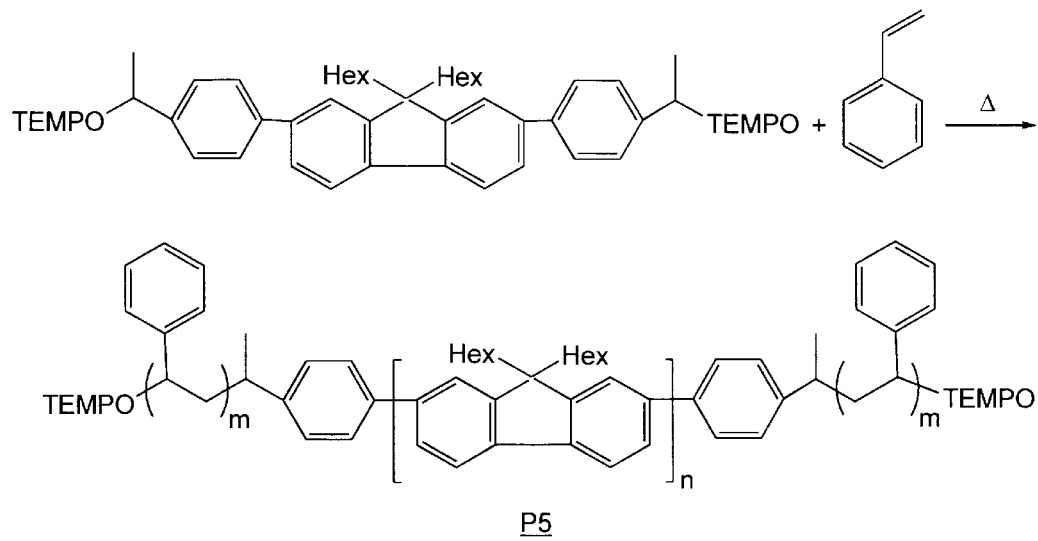
FIG. 3 schematically illustrates macromolecular initiation reactions as described in Examples 6 and 7.
Figure 3:
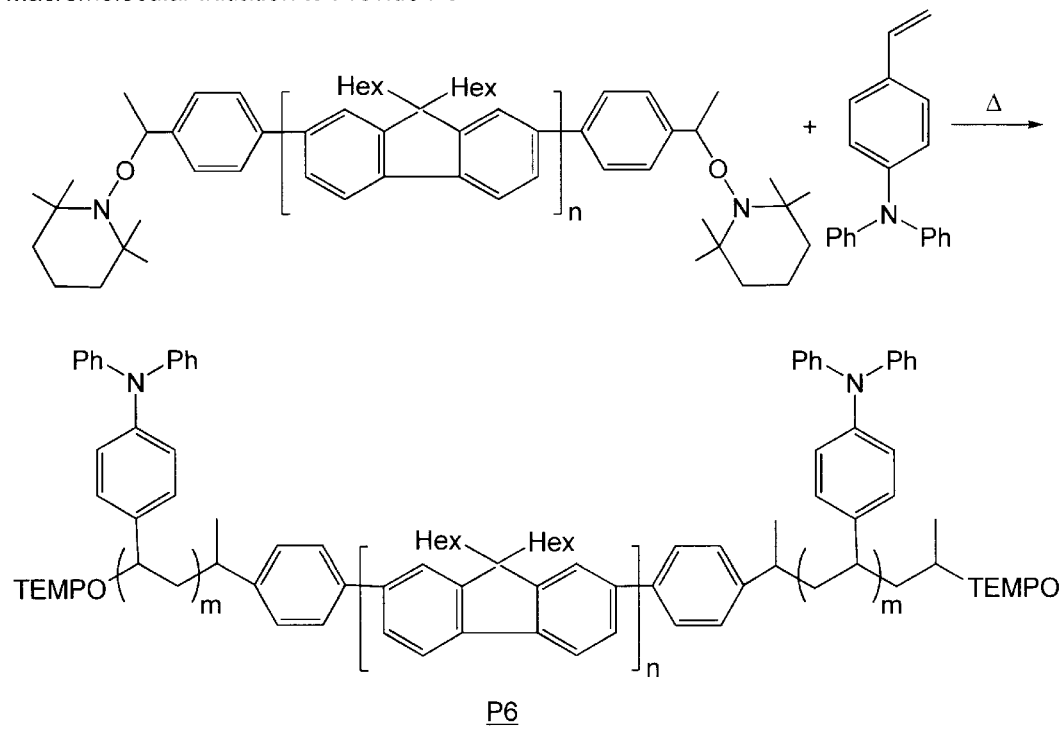

In another embodiment, the novel copolymers are brush-type graft copolymers. It will be appreciated by those skilled in the art that "brush-type" graft copolymers are polymers comprised of a backbone polymer chain to which are attached a plurality of pendant polymer chains, with the attached (or "grafted") pendant polymer chains chemically distinct from the backbone polymer chain. In the brush-type copolymers of the invention, the backbone segment of the copolymer has a first property and the pendant chains have other properties. Preferably, the backbone is light emitting and the pendant chains are charge transporting, or vice versa. The monomer units in the charge transporting polymeric segments are as set forth with respect to the A-B-A triblock copolymers described in the preceding section. That is, when the charge transporting segment is to be hole transporting, the monomer units are preferably arylamines, while when the transporting segment is to be electron transporting, the monomer units are conjugated aromatic moieties, e.g., oxazines, oxathiazenes, thiophenes, oxadiazoles, and the like. The monomer units in the light emitting polymeric segment are also as set forth with regard to the A-B-A triblock copolymers, i.e., they are polycyclic aromatic moieties that are typically although not necessarily fluorescent. In this case, however, a fraction of the aromatic monomers that are polymerized to form the polymer backbone are provided with branch points that enable synthesis of the pendant, "grafted" polymer chains. Thus, for example, to prepare brush-type copolymers having a light emitting backbone and charge transporting pendant chains, one would carry out the reaction shown in Scheme 1 but add in polymerizable monomers Hal-[Z]-Hal wherein Z is identical to X but includes a reactive site enabling branching. A specific example of such a reaction is illustrated comprehensively in FIG. 3, wherein a first monomer is a 9,9-alkyl-substituted fluorene and a second monomer is a functionalized 9,9-di-substituted fluorene as shown, resulting in a backbone containing both such monomers, wherein the functionalized 9,9-di-substituted monomer units enable preparation of additional polymeric segments at the 9-position of those monomers in the polymer chain.

It will be appreciated by those skilled in the art that the present methodology can be used to prepare combinations of copolymer types, e.g., brush-type polymers having pendant chains that are branched, brush-type polymers containing copolymeric pendant chains, A-B-A triblock copolymers in which the A blocks are provided with pendant chains, and the like. Such modifications of the basic polymers and processes disclosed herein are within the scope of the present invention.

Opto-Electronic Device

The devices that may be fabricated using the present electroactive copolymers synthetic methods include LEDs, photovoltaic cells, photoconductors, photodetectors, and chemical and biochemical sensors. A primary application of the present invention is in the fabrication of LEDs, semiconductor devices that convert electrical energy into electromagnetic radiation and are suitable for use as illumination sources, in displays and in indicator lamps.

Figure 10:
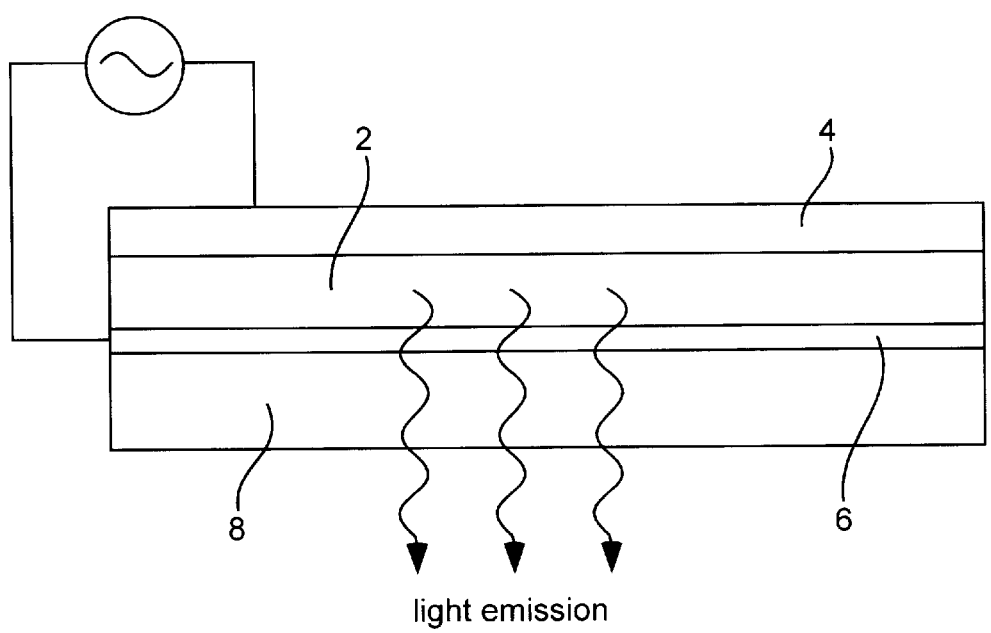
FIG. 10 is a cross-sectional view of an embodiment of a light-emitting device as may be prepared using the electroactive copolymers of the invention.

FIG. 10 illustrates an LED prepared using the composition and method of the invention. A charge transporting and emissive layer 2 comprises an electroactive copolymer of the invention and is sandwiched between and contiguous with opaque electrode 4 and transparent electrode 6. The device is supported on a glass base 8. When a voltage is applied to electrodes 4 and 6, electrons and holes are injected from opposite electrodes, and light is emitted from layer 2 which then radiates from the device through transparent electrode 6 and glass base 8. The electrodes 4 and 6 comprise a conductive material. Suitable opaque electrodes can comprise gold, aluminum, copper, silver or alloys thereof Suitable transparent electrodes comprise, for example, indium tin oxide, polyaniline or polythiophene.

Such a device is conveniently fabricated by dissolving a dual use polymer as provided herein in a suitable solvent, e.g., p-xylene, toluene, or the like, and casting a film of the polymer solution on one of the electrodes. The polymer film is then cured using conventional means. Alternatively, the dual use polymer can be synthesized on a substrate such as an electrode surface using the synthetic processor discussed in detail herein. Subsequent layers can be provided in a similar manner, if desired. In the final fabrication step, the second electrode is formed or deposited on the exposed cured surface.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXPERIMENTAL

The following examples are put forth so as to provide those of ordinary skill in the art with a complete disclosure and description of how to prepare and use the oligomers and polymers disclosed and claimed herein. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

Instrumentation

The synthesized compounds were identified by their $^1$H and $^{13}$C-NMR spectra obtained on a Bruker AF 250 Spectrometer. Melting points were determined using a Gallenkamp melting point apparatus and are uncorrected. UV-visible and fluorescence spectra were obtained with a Hewlett Packard 8452A diode array spectrophotometer and an SA Instruments FL3-11 Fluorometer, respectively. Thermogravimetric analysis (TGA) and Differential Scanning Calorimeter (DSC) of the polymers were performed under a nitrogen atmosphere at a heating rate of 10° C./min with a Perkin Elmer TGS-2 and a DuPont 2100 analyzer, respectively. A Waters 150-C Gel Permeation Chromatograph was used to determine molecular weights of the polymers which are based on poly(styrene) standards.

EXAMPLE 1

Synthesis of an End-Capping Initiator 1-(4'-bromophenyl)-1-(2",2",6",6"-tetramethyl-1-piperidinyloxy)ethyl, 1 (FIG. 1): To a solution of p-bromostyrene, (25.0 g, 137 mmol) and 2,2,6,6-tetramethylpiperidinyloxy (TEMPO) (21.3 g, 137 mmol) in 1:1 toluene/ethanol (1000 mL) was added [N,N'-bis(3,5-di-t-butylsalicylidene)-1,2-cyclohexanediaminato] manganese (III) chloride (13.0 g, 20.5 mmol). The reaction mixture was then stirred at room temperature for 12 hours, evaporated to dryness, partitioned between dichloromethane (3×200 mL) and water (400 mL), and the aqueous layer further extracted with dichloromethane (3×200 mL). The combined organic layers were then dried, evaporated to dryness, and the crude product purified by flash chromatography eluting with 1:9 dichloromethane/hexane gradually increasing to 2:1 dichloromethane/hexane. The desired bromo-substituted alkoxyamine, 1, was obtained as a white solid, mp. 45–46° C. Yield 72%; $^1$H NMR (CDCl$_3$) δ: 0.60, 0.95, 1.09, 1.21 (each br s, 12H, CH$_3$), 1.24–1.58 (m, 6H CH$_2$), 1.42 (d, J=4 Hz, 3H, CH$_3$), 4.71 (Abq, J=4 Hz, 1 H, CH), and 7.10 and 7.20 (Abq, J=8 Hz, 4 H, ArH); $^{13}$C NMR (CDCl$_3$): δ17.20, 20.35, 23.52, 34.21, 34.43, 60.08, 82.66, 127.30, 128.32, 135.86, and 146.17; mass spectrum (EI) m/z 339/341 (1:1).

EXAMPLE 2

Synthesis of a Macromolecular End Capper

Polymerization of 4-vinyltriphenylamine with 1 to provide P1 (FIG. 1): A mixture of the bromo-substituted alkoxyamine 1 (9.50 g, 1.5 mmol) and 4-vinyltriphenylamine (9.97 g, 36.8 mmol, 25 equivalents) was dissolved in chlorobenzene (10 mL) and the reaction mixture heated at 125° C. for 24 hours. The viscous solution was then precipitated twice into methanol (500 mL) followed by redissolution into dichloromethane (25 mL) and precipitation into hexane (500 mL). The purified polymer was collected by vacumn [sic] filtration and dried to give the bromo-phenyl-terminated poly(vinyltriphenylamine) as an off-white solid (7.78 g, 74%); $^1$H NMR (CDCl$_3$): $\delta$0.95–1.20 (minor peaks due to TEMPO end group), 1.40–2.20 (m, 3H, CH and CH$_2$ of backbone) and 6.50–7.20 (m, 14 H, ArH); GPC (Pst equivalent Mn=2300, PDI=1.22).

EXAMPLE 3

Synthesis of a Macromolecular End Capper

Polymerization of N-vinylcarbazole with 1 to provide P2 (FIG. 1): A mixture of the bromophenyl-substituted alkoxyamine 1 (0.50 g, 1.5 mmol) and N-vinylcarbazole (7.10 g, 36.8 mmol. 25 equivalents) was dissolved in chlorobenzene (7.0 mL) and the reaction mixture heated at 125° C. for 24 hours. The viscous solution was then precipitated twice into methanol (500 mL) followed by redissolution into dichloromethane (25 mL) and precipitation into hexane (500 mL). The purified polymer was collected by vacuum filtration and dried to give the bromophenyl-terminated poly(vinylcarbazole) as an off-white solid (5.92 g, 78%); $^1$H NMR (CDCl$_3$): $\delta$0.95–1.20 (minor peaks due to TEMPO end group), 1.40–2.20 (m, 3 H, CH and CH$_2$ of backbone) and 6.10–7.20 and 7.50–8.00 (m, 8 H, ArH); GPC PSt equivalent Mn=2000, PDI=1.28).

EXAMPLE 4

Synthesis of a Macromolecular End Capper

Figure 2:
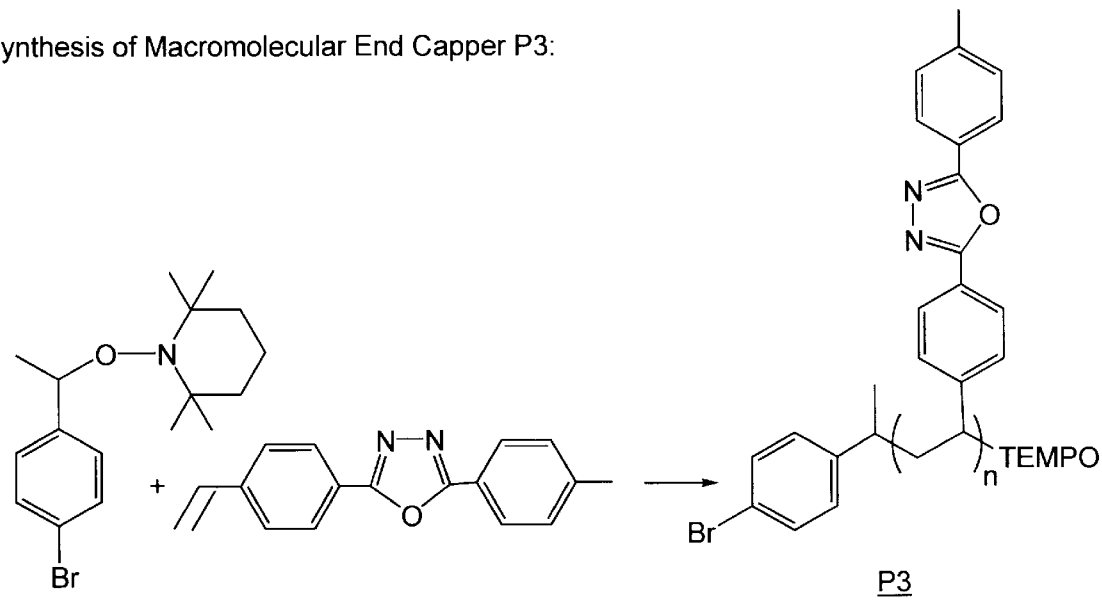
FIG. 2 schematically illustrates preparation of a macromolecular end capping reagent and a macromolecular initiator, as described in Examples 4 and 5, respectively.
Figure 2:
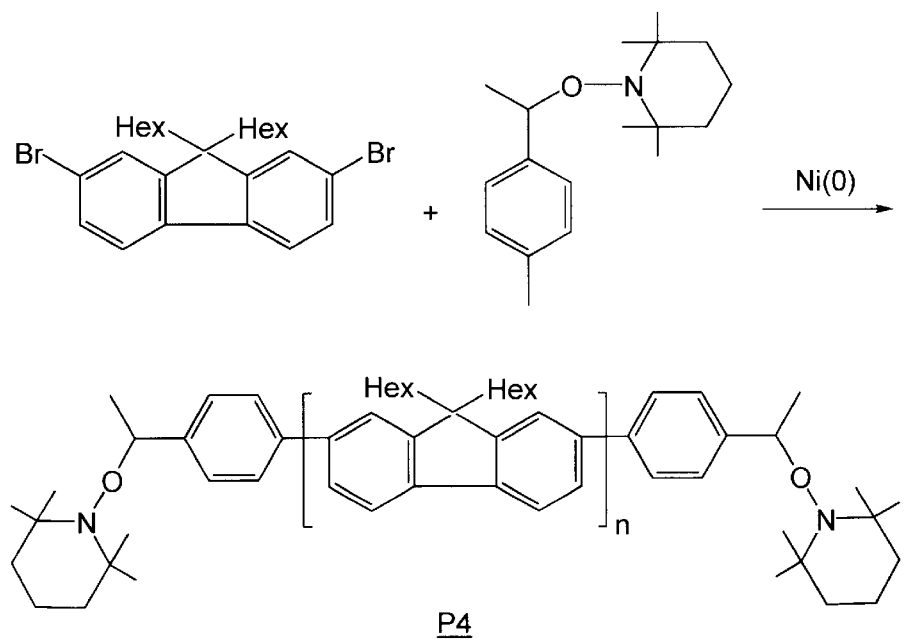

Polymerization of 2-styryl-5-p-methylphenyloxadiazole with 1 to provide P3 (FIG. 2): A mixture of the bromo-substituted alkoxyamine 1 (0.50 g, 1.5 mmol) and 2-styryl-5-p-methylphenyloxadiazole (7.70 g, 29.4 mmol, 20 equivalents) was dissolved in chlorobenzene (7.5 mL) and the reaction mixture heated at 125° C. for 16 hours. The viscous solution was then precipitated twice into methanol (500 mL) followed by redissolution into dichloromethane (25 mL) and precipitation into hexane (500 mL). The purified polymer was collected by vacumn filtration and dried to give the bromophenyl-terminated poly(oxadiazole) as an off-white solid (6.64 g, 81%); $^1$H NMR (CDCl$_3$) $\delta$0.90–1.20 (minor peaks due to TEMPO end group), 1.40–2.20 (m, 3 H, CH and CH$_2$ of backbone), 2.40 (br s, 3 H. CH$_3$), and 6.50–7.20 and 7.40–8.00 (m, 8 H, ArH); GPC (PSt equivalent Mn=2800, PDI=1.18).

EXAMPLE 5

Synthesis of a Macromolecular Initiator

Preparation of poly(di-n-hexylfluorene) end capped with alkoxyamine substituents P4 (FIG. 2): A Schlenk tube containing 700 mg(2.54 mmol) of bis(1,5-cyclooctadiene) nicket(0), 450 mg (2.9 mmol) of 2,2'-bipyridyl,) 0.2 mL of 1,5-cyclooctadiene, 6 mL of dry DMF and 6 mL of dry toluene was heated under Argon to 80° C. for 0.5 hr. Then 554 mg(1.125 mmol) of 2,7-dibromo-9,9-di-n-hexylfluorene and 132 mg(0.3875 mmol) of the bromoarylalkoxyamine 1 dissolved in 6 mL of degassed toluene were added under argon to the dark blue reaction mixture. Upon addition of the monomers, the color turned to reddish-brown and the viscosity increased. After heating for 1 day in the dark, the hot polymer solution was precipitated into a solution of 100 mL conc. HCL, 100 mL of methanol, and 100 mL of acetone. After isolating the crude product via filtration, the alkoxyamine capped polymer was reprecipitated into a mixture of acetone and methanol for further purification: Mn=5000, PDI=1.8; $^1$H NMR (CDCl$_3$) $\delta$7.4–8 (multiplet, aromatic protons), 2.05 (br singlet, ($\alpha$-methylene protons of hexyl groups), 1.9 (multiplet, remaining —CH$_2$— signals of the n-hexyl substituents) and 0.8 (multiplet, —CH$_3$).

EXAMPLE 6

Macromolecular Initiation

Polymerization of TEMPO-functionalized poly(fluorene) with styrene, P5 (FIG. 3): A mixture of the alkoxyamine-substituted poly(fluorene) P4 (Mn=5,000, PDI=1.80), (0.25 g, 0.05 mmol) and styrene (0.30 g, 2.9 mmol, 30 equivalents per chain end) was dissolved in chlorobenzene (0.5 mL) and the reaction mixture heated at 125° C. for 24 hours. The viscous solution was then precipitated twice into methanol (500 mL) followed by redissolution into dichloromethane (25 mL) and precipitation into hexane (500 mL). The purified polymer was collected by vacuum filtration and dried to give the ABA triblock copolymer, polystyrene-poly (fluorene)-polystyrene P5 as an off-white solid (0.45 g, 82%); $^1$H NMR (CDCl$_3$). $\delta$0.70–0.80 and 1.0–1.1 (peaks due to poly(fluorene) n-hexyl substitutents, 1.40–2.20 (m, CH and CH$_2$ of polystyrene backbone and peak due to $\alpha$-methylenes of n-hexylfluorene substituents)), 6.40-7.20 (m, ArH from poly(styrene) and poly(fluorene)) and 7.50–7.80 (m, ArH from poly(fluorene)); GPC (PSt equivalent Mn=9500, PDI=1.62).

EXAMPLE 7

Macromolecular Initiation

Polymerization of TEMPO-functionalized poly(fluorene) P4 with 4-vinyltriphenylamine, P6 (FIG. 3): A mixture of the alkoxyamine-substituted poly(di-n-hexylfluorene) P4 (Mn=5,000, PDI=1.80), (0.25 g, 0.05 mmol) and 4-vinyltriphenylamine (0.79 g, 2.9 mmol, 30 equivalents per chain end) was dissolved in chlorobenzene (0.75 mL) and the reaction mixture heated at 125° C. for 24 hours. The viscous solution was then precipitated twice into methanol (250 mL) followed by redissolution into dichloromethane (10 mL) and precipitation into hexane (250 mL). The purified polymer was collected by vacuum filtration and dried to give the ABA triblock copolymer, poly (vinyltriphenylamine)-poly(di-n-hexylfluorene)-poly (vinyltriphenylamine) P6 as an off-white solid (0.93 g, 90%); $^1$H NMR (CDCl$_3$). $\delta$0.70–0.80 and 1.0–1.1 (peaks due to n-hexyl substituents of the poly(fluorene)), 1.40–2.20 (m, CH and CH$_2$ of poly(vinyltriphenylamine) backbone and peaks due to the $\alpha$-methyemes units of the n-hexyl substituents on the poly(fluorene) units), 6.40–7.20 (m, ArH from poly(vinyltriphenylamine) and poly di-n-hexyl (fluorene)) and 7.50–7.80 (m, ArH from poly (di-n-hexyl (fluorene)); GPC (PSt equivalent Mn 10,500, PDI=1.68).

EXAMPLE 8

Figure 4:
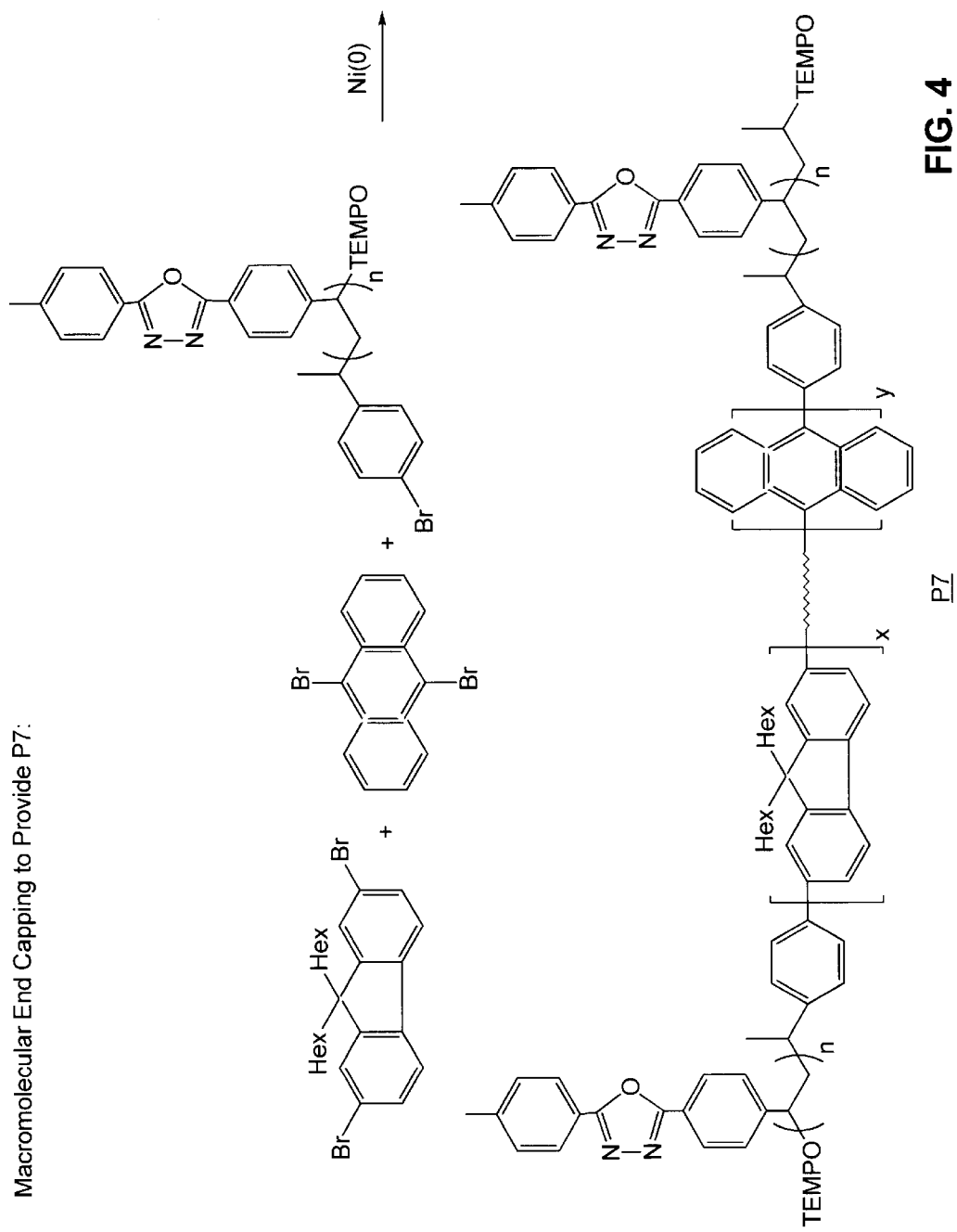
FIG. 4 schematically illustrates the macromolecular end capping reaction described in Example 8, part (a).

Polymerization with Macromolecular End Cappers (a) Preparation of ABA Copolymer (P7) [85/15 Poly(9, 9-di-n-hexylfluorene-co-9,10-anthracene)] End Capped with Poly(2-styryl-5-2-5-p-methylphenyloxadiazole) (FIG. 4): Into a Schlenk tube containing 242 mg (0.88 mmol) of bis(1,5-cyclooctadiene) nickel (0), 95 mg (0.88 mmol) of 1,5-cyclooctadiene and 137.3 mg (0.88 mmol) of 2,2'-bipyridyl was placed 3 mL of dry DMF and 3 mL of toluene. The solution (blue) was heated to 80° C. for 0.5 hours and a degassed mixture of 200 mg (0.41 mmol) of 2,7-dibromo-9,9-di-n-hexylfluorene, 27 mg (0.05 mmol) of 9,10-dibromoanthracene and 200 mg (0.07 mmol) of the bromophenyl-terminated polyoxadiazole P3 described previously (Mn=3000) in 3 mL of degassed toluene were added. Upon addition of the monomers, the reaction color turned reddish-brown and the mixture became more viscous. The reaction mixture was heated for 24 h and the hot polymer solution precipitated into 105 mL of a equivolume mixture of conc HCl, methanol and acetone. After isolation of the polymer by filtration a chloroform solution was reprecipitated into acetone/methanol: 286 mg, (83%), Mn=13,008, PDI=1.9. Based on GPC analysis, the Mn of the DHF/ANT block was 7008 g/mol. $^1$H NMR resonances for the aliphatic protons of the oxadiazole block were observed at $\delta$1.4–2.2, and 2.4. The aliphatic resonances of the DHF units appeared at 0.75, 1.1 and 2.08. The combined aromatic resonances of the block copolymer appeared as broad multiplets at $\delta$6.31–8.10.

Figure 5:
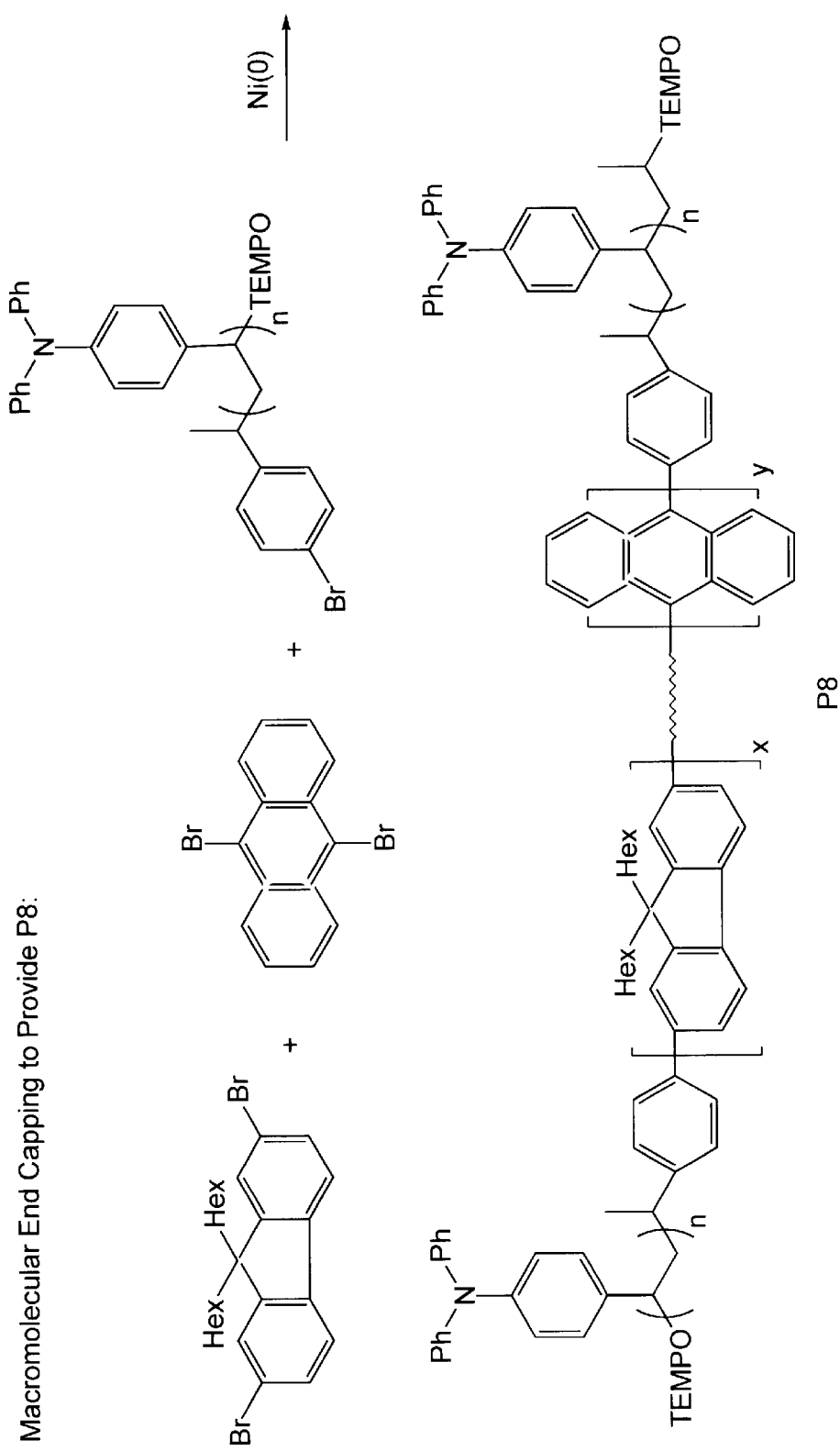
FIG. 5 schematically illustrates the macromolecular end capping reaction described in Example 8, part (b).

(b) Preparation of ABA Block Copolymer (P8) of 85/15 Poly(9,9-di-n-hexyl fluorene-co-9,10-anthracene) End Capped with Poly (vinyl triphenylamine) (FIG. 5): This material was prepared as described above using the following quanitites: 190 mg (0.127 mmol) of p-bromophenyl substituted poly(vinyl triphenylamine) PVTPA, P1 (Mn=1500 g/mol), 541 mg (1.1 mmol) 2.7-dibromo-9,9-di-n-hexylfluorene, 51 mg (0.15 mmol) 9,10-dibromoanthracene, 632 mg (2.3 mmol) bis(1,5-pyclooctadiene) nickel (0), 248 mg (2.3 mmol) 1,5-cyclooctadiene, 359 mg (2.3 mmol) bipyridyl in a mixture of 10 mL of toluene and 5 mL of DMF. Reprecipitation yielded 489 mg (85%) of the ABA blocks copolymer P8; Mn=30,306, PDI-2.3, $^1$H NMR resonances for the PVTPA block were observed at $\delta$1.40–2.20 and 6.50–7.20. The aliphatic resonances for the DHF units appeared at $\delta$0.82, 1.17 and 2.10. The aromatic resonances for the DHF and ANT units appear at $\delta$7.27–8.0. Based on GPC analysis with on polystyrene standards, the Mn of the DBF/ANT block was ca 27,300 g/mol.

EXAMPLE 9

Figure 6:
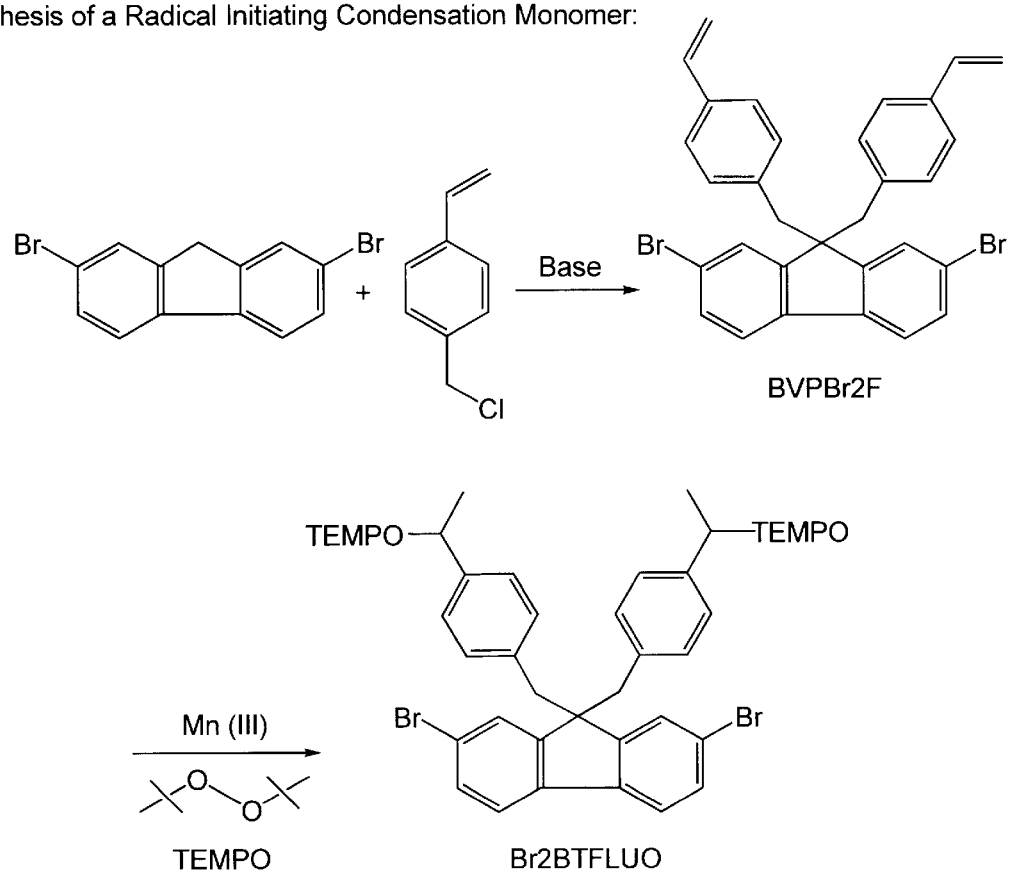
FIG. 6 schematically illustrates preparation of a radical initiating condensation monomer, as described in Example 9, parts (a) and (b).

Preparation of Block-Graft Copolymers (a) 2–7-Dibromo-9,9-bis(4-vinylphenyl)methyl)fluorene (BVPBr2F) (FIG. 6): 20.0 g (62 mmol) of 2,7-dibromofluorene and 22.9 g (150 mmol) of p-chloromethylstyrene were dissolved in 100 mL of toluene and 50 mL of NaOH (50 wt % in water) was added to the above solution. 0.1 g of tetra(n-butyl)ammonium bromide was added to the above mixture as a phase transfer catalyst. The color of mixture turned dark brown as soon as phase transfer catalyst was added. The mixture was stirred at room temperature for 12 hours. Ethyl acetate was added and the organic phase washed with water several times to remove NaOH. The organic layer was dried over anhydrous magnesium sulfate and the solvent was removed by rotary evaporator. The product was obtained by precipitating against n-hexane and methanol. The yield was 28 g (81%). $^1$H NMR (CDCl$_3$) $\delta$7.5–7.0(m, 6H), 6.9(d, 4H), 6.5(d, 4H), 6.5–6.3(q, 2H), 5.5(d, 2H), 5.0(d, 2H), 3.2(s, 4H); $^{13}$C NMR (CDCl$_3$), $\delta$150.1, 138.9, 136.5, 135.8, 135.5, 130.3, 127.8, 125.3, 121.3, 120.6, 113.2, 57.2, 45.0.

(b) 1-((4-(2,7-dibromo-9-((4-(2,2,6,6-tetramethylpiperidyloxy)ethyl)phenyl) methyl)fluorene-9-yl)methyl)phenyl)ethoxy)-2,2,6,6-tetramethylpiperidine, (Br2BTFLUO) (FIG. 6): To a solution of BVPBr2F (15.0 g, 27 mmol) and 2,2,6,6-tetramethylpiperidinyloxy (TEMPO) (24.0 g, 154 mmol) in 1:1 toluene/ethanol (1000 mL) was added (N,N'-bis(3,5-di-tert-butylsalicylidene)-1,2-cycohexanediaminato) manganese (III) chloride (16.8 g, 26.5 mmol) followed by di-tert-butyl peroxide (24 g, 164 mmol) and sodium borohydride (12 g, 316 mmol). The reaction mixture was then stirred at room temperature for 16 hours, evaporated to dryness, partitioned between dichloromethane (250 mL) and water (400 mL), and the aqueous layer further extracted with dichloromethane (3×250 mL). The combined organic layers were then dried, evaporated to dryness, and the crude product purified by flash chromatography eluting eith n-hexane:ethyl acetate (50:1). The desired alkoxyamine was obtained as a white solid and the yield was 8.0 g (34%). $^1$H NMR (CDCl$_3$) $\delta$7.5–7.1 (m, 6H), 6.9(d, 4H), 6.4(d, 4H), 4.5(q, 2H), 3.3(s, 4H), 1.5–0.3(m, 42H); $^{13}$C NMR (CDCl$_3$) $\delta$:150.4, 143.8, 138.8, 134.7, 130.2, 129.8, 128.0, 126.9, 126.0, 121.0, 120.4, 82.9, 59.8, 57.1, 44.8, 40.3, 34.2, 23.0, 20.3, 17.2; mp 65–67° C.

Figure 7:
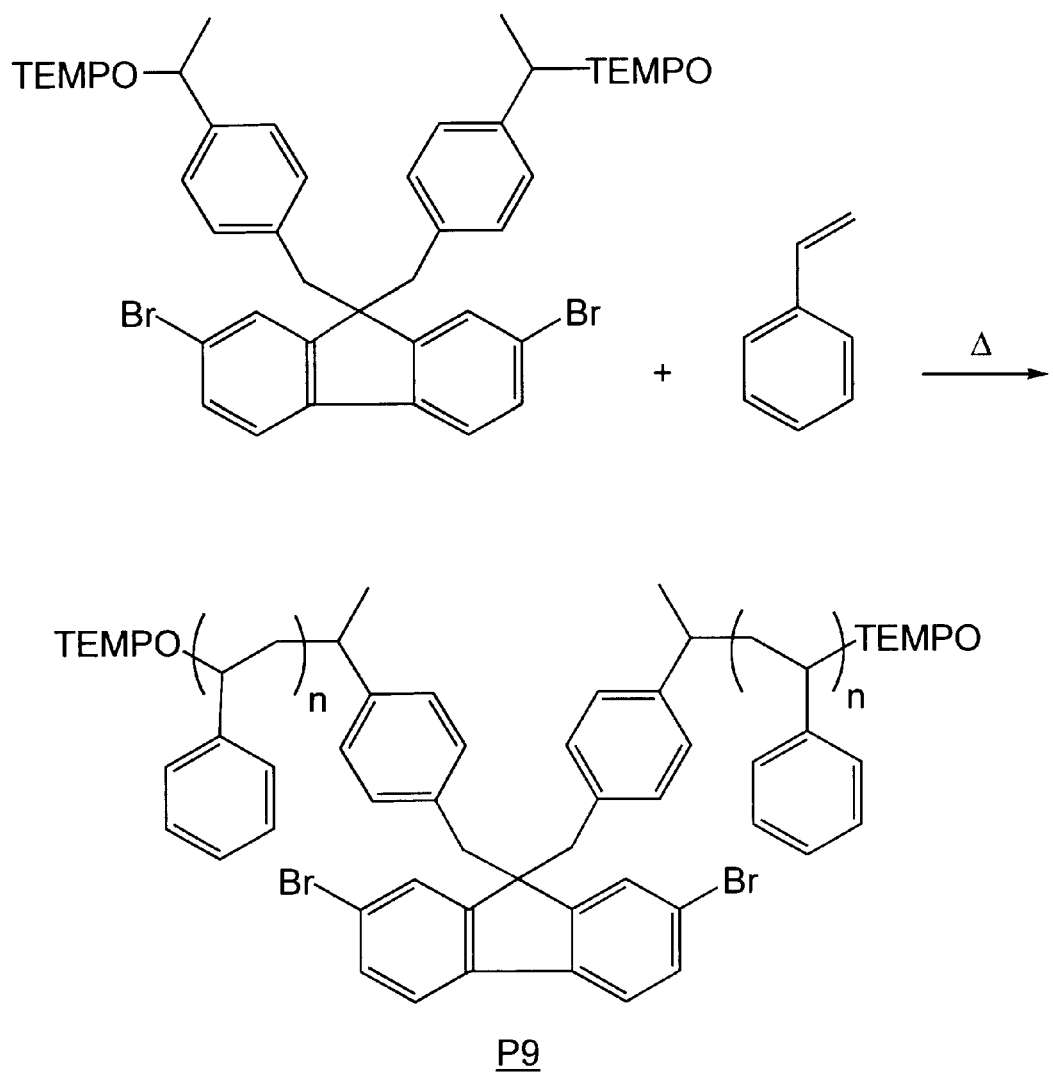
FIG. 7 schematically illustrates preparation of polystyrene grafted on "Br2BTFLUO" as described in Example 9, part (c).

(c) Grafting Polystyrene on Br2BTFLUO, P9 (FIG. 7): Into a dry vial were introduced the initiator Br2BTFLUO (500 mg, 0.57 mmol), styrene (295 mg, 2.84 mmol) and acetic anhydride (400 mg. 3.9 mmol). The solution was degassed and sealed under argon before heating to 125° C. for 16 hours. The molecular weight of polystyrene could be controlled by the feed ratio of styrene and the initiator. The polymer was dissolved in chloroform and then precipitated into methanol. After filtering and drying under vacuum, a white solid was obtained; (90%) Mn=5766, PDI=1.15; $^1$H NMR (CDCl$_3$) $\delta$0.9–2.5 (polystyrene and initiator aliphatic resonances), 3.2 (PhCH$_2$), 4.0 (CH$_3$ CHPh) 6.3–7.5 (polystyrene and initiator aromatic resonances); Tg=100° C.

Figure 8:
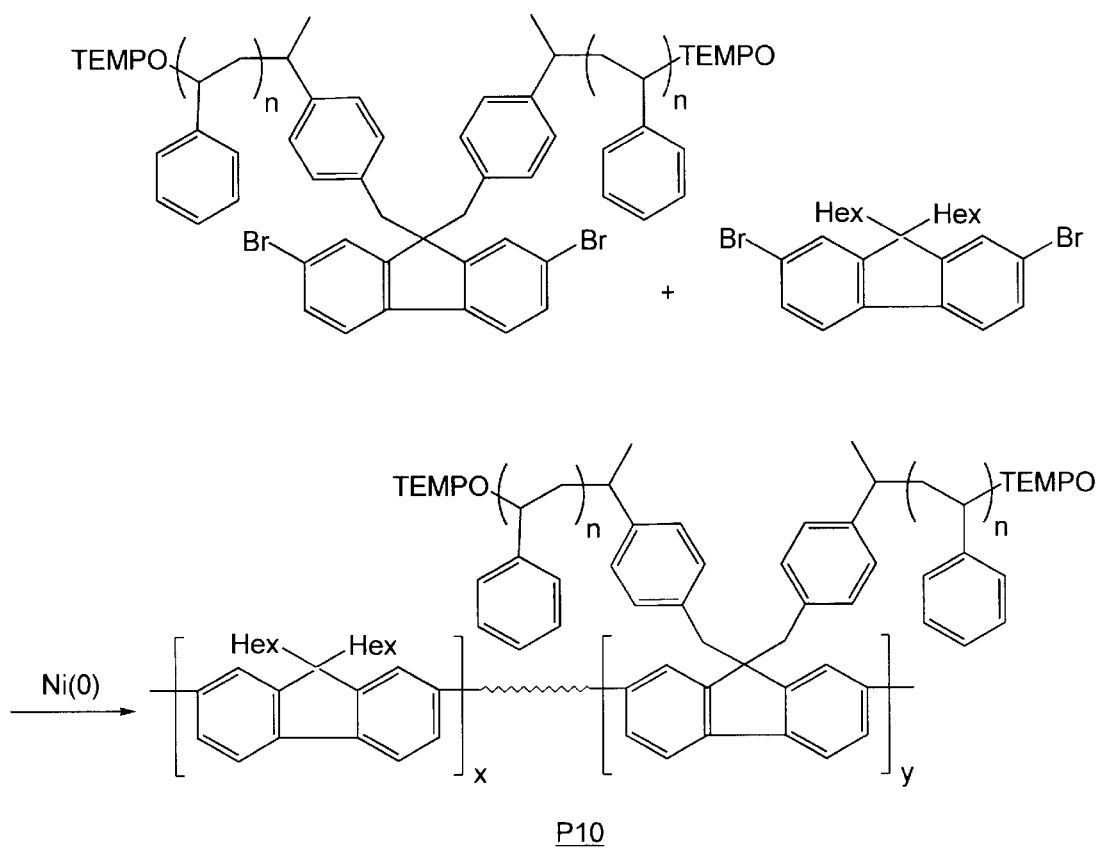
FIG. 8 schematically illustrates the Yamamoto polymerization reaction described in Example 9, part (d).

(d) Yamamoto Polymerization (FIG. 8): The statistical copolymers P10 from 2,7-dibromo-9,9-di-n-hexylfluorene and the 2,7-dibromofluorene containing polystyrene, P9, were synthesized through nickel (0) mediated Yamamoto polymerization. A Schlenk tube containing 6 mL toluene, 6 mL DMF, bis(1,5-cyclooctadienyl) nickel (0) (460 mg, 1.67 mmol) and 261 mg (1.67 mmol) of 2,2'-bipyridyl and 1,5-cyclooctadiene (180 mg, 1.67 mmol) (molar ratios, 1:1:1) was heated under nitrogen to 80° C. for 0.5 hr. The monomers Br2DHF (443 mg, 0.9 mmol) and 577 mg (0.1 mmol) of P-9, molecular weight 1 K, dissolved in 6 mL toluene were added to the above solution and the polymerization was maintained at 80° C. for 24 hours. 5 Mol % of 2-bromo-9,9-di-n-hexylfluorene was added with monomers for end-capping. The polymer P10 was precipitated from an equivolume mixture of conc. HCl, methanol and acetone. The isolated polymer was dissolved in chloroform and re-precipitated in methanol-acetone (1:1). Finally, the polymer was dried at 60° C. under vacuum; 85%, Mn=23, 901, PDI=2.65, $^1$H NMR (CDCl$_3$) $\delta$. 0.9–2.4 polystyrene and initiator core aliphatic resonances), 0.8, 1.2, 2.1 (DHF aliphatic resonances), 6.2- 7.2 (polystyrene aromatic resonances), 7.5–8.0 (DHF aromatic resonances); Tg 98° C.; $\lambda_{max}$(THF)=384 nm.

Figure 9:
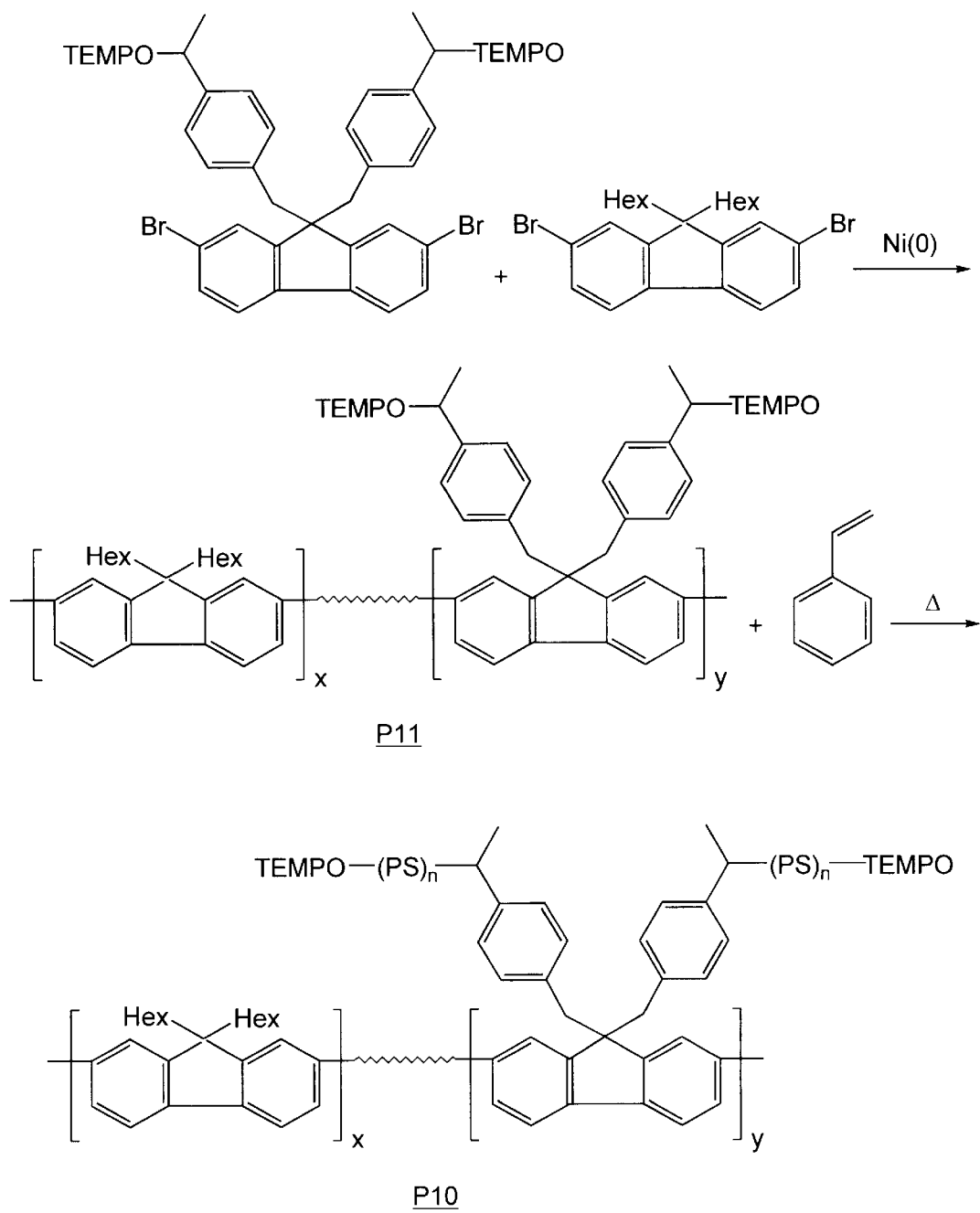
FIG. 9 schematically illustrates the macromolecular initiated radical polymerization reaction described in Example 9, part (e).

(e) Nickel-Mediated Copolymerization of Br2BTFLUO and Br2DHF, P11 (FIG. 9): The statistical copolymers from 2,7-dibromo-9,9-di-n-hexyl fluorene (Br2DHF) and the TEMPO-functionalized monomer Br2BTFLUO were prepared as described. Into a Schlenk tube was placed 460 mg (1.67 mmol) of bis(1,5-cyclooctadiene) nickel (0), 261 mg (1.67 mmol) of bipyridyl, 180 mg (1.67 mmol) of 1,5- cyclooctadiene in 12 mL of a 1:1 DMF/toluene solvent mixture and the contents heated to 80° C. for 0.5 h. Then a mixture of 418 mg (0.85 mmol) of 2,7-dibromo-9,9-di-n-hexylfluorene, 88 mg (0.10 mmol) of the TEMPO-functionalized initiator Br2BTFLUO and 21 mg (0.05 mmol) of 2-bromo-9,9-di-n-hexylfluorene in 6 mL of toluene was added and the mixture heated at 80° C. for 24 h. The polymer was precipitated and purified as described previously. 82%, Mn=25,918, PDI=3.5; $^1$H NMR (CDCl$_3$) 0.7–2.1 (aliphatic protons of DHF and initiator units), 6.8–7.9 (aromatic protons of DHF and initiator units), 3.5 (PhCH$_2$—), 4.6 (CH$_3$CHO—); Tg-109° C.

(f) Graft Polymerization of Poly(styrene) to the Copolymer, P11; alternate preparation of P10: Into a flask with N$_2$ was placed 100 mg of the polymer P11 (90/10 DHF/BTLUO), 1.1 g of distilled styrene, and 10 mg of acetic anhydride, and the reaction mixture was heated to 125° C. for 24 hr. The solution was precipitated into methanol followed by filtration. The solid was redissolved in dichloromethane and reprecipitated into hexane to yield the purified polymer P10.

What is claimed is:

1. A dual purpose electroactive copolymer comprising a polymeric charge transporting segment composed of electron-transporting or hole-transporting monomer units, and a polymeric light emitting segment composed of polycyclic aromatic monomer units.

2. The dual purpose electroactive copolymer of claim 1, comprising two or more polymeric charge transporting segments.

3. The dual purpose electroactive copolymer of claim 2, comprising an A-B-A block copolymer in which each A represents a polymeric charge transporting segment and B represents the polymeric light emitting segment.

4. The dual purpose electroactive copolymer of claim 2, comprising a brush-type graft copolymer having a backbone and pendant chains covalently bound thereto.

5. The dual purpose electroactive copolymer of claim 4, wherein the polymeric light emitting segment represents the backbone of the copolymer, and the polymeric charge transporting segments represent the pendant chains covalently bound thereto.

6. The dual purpose electroactive copolymer of claim 3, wherein the polymeric charge transporting segments are comprised of arylamine monomer units.

7. The dual purpose electroactive copolymer of claim 5, wherein the polymeric charge transporting segments are comprised of arylamine monomer units.

8. The dual purpose electroactive copolymer of claim 3, wherein the polymeric charge transporting segments are comprised of conjugated electron-deficient monomer units.

9. The dual purpose electroactive copolymer of claim 5, wherein the polymeric charge transporting segments are comprised of electron-deficient or electron-rich monomer units.

10. The dual purpose electroactive copolymer of claim 8, wherein the monomer units are selected from the group consisting of aryl sulfones, aryl sulfoxides, fluorinated aryls, biphenyls, diaryl phosphine oxides, benzophenones, 1,2,3-triazole, 1,2,4-triazole, 1,2,3-oxadiazole, 1,2,4-oxadiazole, 1,2,5-oxadiazole, 1,3,4-oxadiazole, 3,5-diaryl-1,2,4-oxadiazole, 3,4-diaryl-1,2,5-oxadiazole, 2,5-diaryl-1,3,4-oxadiazole, 1,4-oxazine, 1,2,5-oxathiazine, benzothiophene, 2,5-diaryl oxadiazoles, thiophene, benzothiophene, pyridines, quinolines, quinoxalines, and pyrimidines.

11. The dual purpose electroactive copolymer of claim 10, wherein the monomer units comprise substituted ethylene units —CH$_2$—CHR— in which R is selected from the group consisting of aryl sulfones, aryl sulfoxides, fluorinated aryls, biphenyls, diaryl phosphine oxides, benzophenones, 1,2,3-triazole, 1,2,4-triazole, 1,2,3-oxadiazole, 1,2,4-oxadiazole, 1,2,5-oxadiazole, 1,3,4-oxadiazole, 3,5-diaryl-1,2,4-oxadiazole, 3,4-diaryl- 1,2,5-oxadiazole, 2,5-diaryl-1,3,4-oxadiazole, 1,4-oxazine, 1,2,5-oxathiazine, 2,5-diaryl oxadiazoles, pyridines, quinolines, quinoxalines, and pyrimidines.

12. The dual purpose electroactive copolymer of claim 1, wherein the polycyclic aromatic monomer units are fluorescent.

13. The dual purpose electroactive copolymer of claim 12, wherein the polycyclic aromatic monomer units comprise fluorene or a derivative thereof.

14. The dual purpose electroactive copolymer of claim 13, wherein the polycyclic aromatic monomer units each comprise a 9,9-dialkylfluorene moiety, and further wherein each such moiety is bound through its 2-position to a first adjacent monomer unit and through its 7-position to a second adjacent monomer unit.

15. The dual purpose electroactive copolymer of claim 13, wherein the polycyclic aromatic monomer units each comprise a fluorene moiety, wherein at least some of the moieties are bound through their 9-position to one or two of the pendant chains.

* * * * *

UNITED STATES PATENT AND TRADEMARK OFFICE
CERTIFICATE OF CORRECTION

PATENT NO.     : 6,512,070 B2
DATED          : January 28, 2003
INVENTOR(S)    : Craig Jon Hawker et al.

It is certified that error appears in the above-identified patent and that said Letters Patent is hereby corrected as shown below:

<u>Title page,</u>
Item [73], Assignee, please add the following: -- The Board of Trustees of the Leland Stanford Junior University, Stanford, California. --

Signed and Sealed this

Seventeenth Day of February, 2004

JON W. DUDAS
*Acting Director of the United States Patent and Trademark Office*